(12) United States Patent
Sjostrom

(10) Patent No.: US 7,919,218 B2
(45) Date of Patent: Apr. 5, 2011

(54) METHOD FOR A MULTIPLE EXPOSURE BEAMS LITHOGRAPHY TOOL

(75) Inventor: Fredrik Sjostrom, Taby (SE)

(73) Assignee: Micronic Laser Systems AB, Taby (SE)

( * ) Notice: Subject to any disclaimer, the term of this patent is extended or adjusted under 35 U.S.C. 154(b) by 426 days.

(21) Appl. No.: 11/918,576

(22) PCT Filed: Apr. 19, 2005

(86) PCT No.: PCT/SE2005/000560
§ 371 (c)(1),
(2), (4) Date: Dec. 3, 2008

(87) PCT Pub. No.: WO2006/110073
PCT Pub. Date: Oct. 19, 2006

(65) Prior Publication Data
US 2009/0197188 A1 Aug. 6, 2009

(51) Int. Cl.
*G03F 7/20* (2006.01)
(52) U.S. Cl. ......................................................... 430/30
(58) Field of Classification Search .................... 430/30, 430/327, 396
See application file for complete search history.

(56) References Cited

U.S. PATENT DOCUMENTS

| | | | |
|---|---|---|---|
| 5,843,603 | A | 12/1998 | Ando et al. |
| 5,910,847 | A | 6/1999 | Van der Werf et al. |
| 6,285,488 | B1 | 9/2001 | Sandstrom |
| 6,333,138 | B1 | 12/2001 | Higashikawa et al. |
| 6,383,719 | B1 | 5/2002 | Bula et al. |
| 6,556,279 | B1 | 4/2003 | Meisburger et al. |
| 2003/0222966 | A1 | 12/2003 | Shirota et al. |

FOREIGN PATENT DOCUMENTS

| | | |
|---|---|---|
| JP | 2004 144885 | 5/2004 |
| WO | WO-0072090 | 11/2000 |

*Primary Examiner* — Christopher G Young
(74) *Attorney, Agent, or Firm* — Haynes Beffel & Wolfeld LLP; Ernest J. Beffel, Jr.

(57) ABSTRACT

An aspect of the present invention includes a method for patterning a workpiece covered at least partly with a layer sensitive to electromagnetic radiation by simultaneously using a plurality of exposure beams. In an example embodiment it is determined if any of the beams have an actual position relative to a reference beam which differs from its intended position. An adjustment of the exposure dose for a wrongly positioned beam is performed if said beam is printed at en edge of a feature. Other aspects of the present invention are reflected in the detailed description, figures and claims.

13 Claims, 6 Drawing Sheets

METHOD FOR A MULTIPLE EXPOSURE BEAMS LITHOGRAPHY TOOL

TECHNICAL FIELD

The present invention relates to a method for patterning a workpiece, in particular it relates to method to enhance an image to be patterned on said workpiece by using a plurality of exposure beams.

BACKGROUND OF THE INVENTION

When creating cyclic patterns in masks or reticles for the production of for instance displays, such as TFT-LCD's or plasma-displays, or when creating a pattern directly on a semiconducting wafer, i.e., direct writing, a key quality requirement is the absence of defects, such as shade differences, light and dark fields, stripes or lines in said pattern.

Deviations, e.g. CD (critical dimension) or positioning errors, causing said defects are usually very small, from a few hundred nanometers down to or below single nanometers. Deviations of that size spread over a relatively large area on a substrate, such as a display photo mask, which may be 1500× 1200 mm, or a semiconducting wafer may be very difficult, for not saying impossible, to detect by measuring. Unfortunately a human eye is very sensitive to systematic changes and therefore may be able to detect such small deviations as stripes in the image. The human eye is extremely sensitive to periodical intensity variations in the image. The viewing distance will influence the appearance of said periodical intensity variations. Generally speaking, periodical intensity variations may be detectable by the human eye if the difference in contrast is around and above 0,5% in a spatial frequency range of 1-20 mm. For normal viewing distances periodical intensity variations below about 1 mm may not show up.

Periodical defects may be caused by the beating frequencies between a pattern pitch and a system pitch in a certain direction. The pattern pitch may be defined as the distance between equal features in the pattern. The pattern pitch may be different in an X and a Y direction of said pattern. One system pitch in a raster scanning system is a Y-pitch, defining a distance between two adjacent center of gravity of exposure spot sizes along a sweep direction of said exposure beam. A numerous exposure spots, in the range of several hundreds, along the sweep direction are forming a scan line on the workpiece. The exposure spot may preferably be continuously on within a scan line, but may be switched off at any given time determined by a frequency of a clock generator connectable to a modulator which is modulating said exposure beam according to desired pattern data. Another system pitch is an X-pitch, defining a distance between two adjacent parallel scan lines of said exposure beam. A numerous scan lines in X-direction may form a strip. Strips stitched together will form a desired pattern on the workpiece.

Unfortunately, masks, reticles or semiconducting wafers patterned by using multiple exposure beams for increasing the writing speed may present certain side effects such as increased CD (Critical Dimension)-error. i.e., lines or features printed on a workpiece have less uniform line widths and/or features with edge roughness.

What is needed is a method and apparatus, which is capable to pattern any kind of pattern without increasing CD-error and/or feature roughness when creating a pattern on the workpiece by using multiple exposure beams.

SUMMARY OF THE INVENTION

Accordingly, it is an object of the present invention to provide a method of patterning a workpiece, which overcomes or at least reduces the above-mentioned problem of increased CD-error when using a multi beam pattern generator.

This object, among others, is according to a first aspect of the invention attained by a method for patterning a workpiece covered at least partly with a layer sensitive to electromagnetic radiation by simultaneously using a plurality of exposure beams, comprising the actions of: compensating for deviations from a nominal value in distance between adjacent exposure beams by adjusting the dose of at least one of said plurality of exposure beam to reduce CD-errors in said pattern on said workpiece.

In another example embodiment according to the invention said dose may be changed only if the beam is patterning an edge feature.

In still another example embodiment of the present invention said collecting of information may be performed before patterning the feature.

In still another example embodiment according to the present invention said collecting of information is performed at least partly during the patterning.

In still another example embodiment according to the invention said compensation varies along at least one strip of said plurality of exposure beams.

In still another example embodiment according to the present invention said distance between adjacent beams is determined on the workpiece.

In example embodiments according to the present invention there is provided method for patterning a workpiece covered at least partly with a layer sensitive to electromagnetic radiation by simultaneously using a plurality of exposure beams. The method may include the actions of determining if any of the beams have an actual position relative to a reference beam which differs from its intended position, adjusting the exposure dose for a wrongly positioned beam if said beam is printed at en edge of a feature.

In another example embodiment according to the present invention said adjustment varies along at least one strip of said plurality of exposure beams.

In still another example embodiment according to the present invention said actual position is measured on the workpiece.

In still another example embodiment according to the present invention said distance between adjacent beams is determined by at least one measurement on a reference mark.

In yet another example embodiment according to the present invention said actual position is measured on a reference mark.

Further characteristics of the invention, and advantages thereof, will be evident from the detailed description of preferred embodiments of the present invention given hereinafter and the accompanying FIGS. 1-5, which are given by way of illustration only, and thus are not limitative of the present invention.

BRIEF DESCRIPTION OF THE DRAWINGS

FIG. 3b depicts the writing situation by using the beams as depicted in FIG. 3a.

FIG. 3c depicts different possibilities for writing a two pixel line by using the beams as depicted in FIG. 3a.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Further, the preferred embodiments are described with reference to a laser scanning pattern generator. It will be obvious to one with ordinary skill in the art that any exposure means may be equally applicable, such as light from IR to EUV, x-ray or particle beams such as electron, ion or atom beams.

The invention is further described with reference to the production of a mask or reticle for example for the production of a cyclic pattern on for instance a display. It will be obvious to one with ordinary skill in the art that the inventive method and apparatus is equally applicable in the direct writing of any pattern in masks, reticles displays or other semiconductor components, large area patterns as well as small area patterns.

Figure 4:
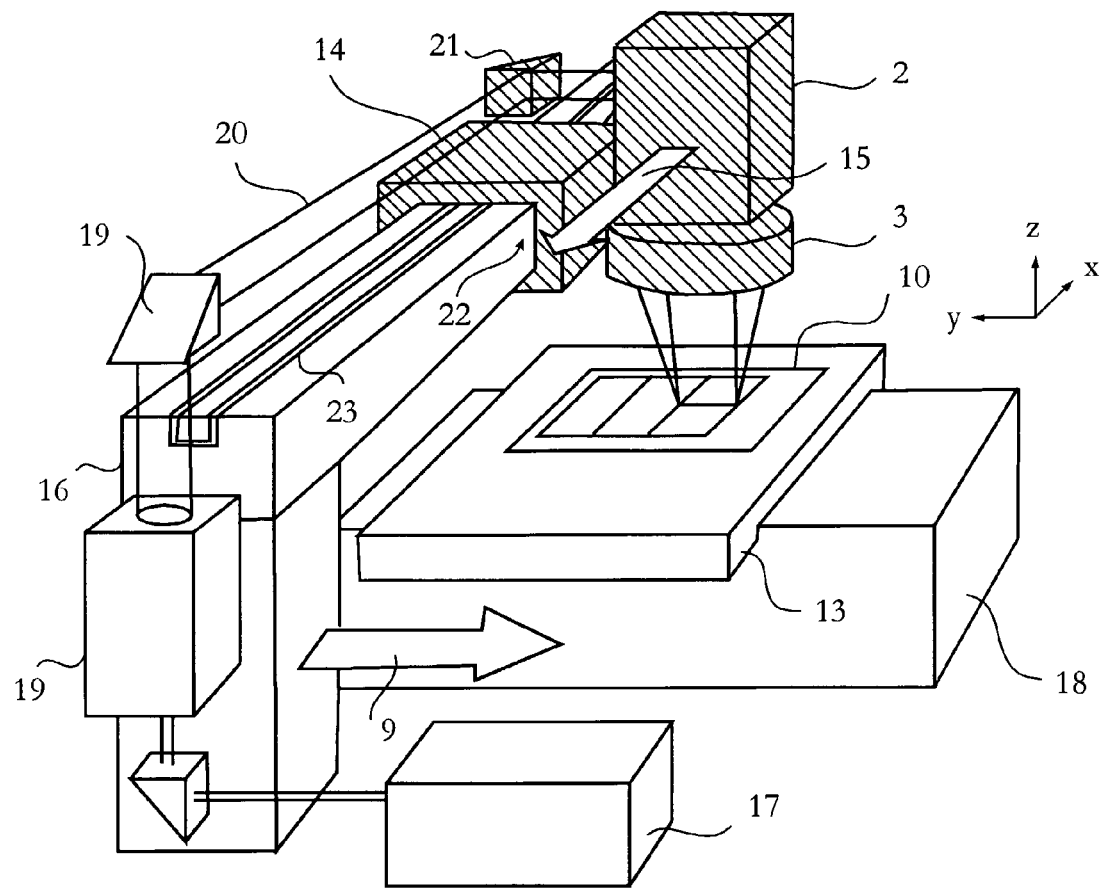
FIG. 4 depicts an embodiment of a laser pattern generator according to prior art.

FIG. 4 illustrates an example embodiment of a laser pattern generator according to prior art. In this example embodiment, a support structure 13 is carrying the workpiece 10. A writing head comprising an optical system 2 for generating object pixels on said workpiece 10 and a final lens 3 is placed on a carriage 14 that slides along a guiding rail 16 essentially along a direction x 15. The parts moving with the carriage 14 are shown hatched in FIG. 1. The guiding rail 16 moves essentially along a direction y 9. In one example embodiment said guiding rail is moved in a stepwise fashion and said carriage 14 is moving in a continuous fashion, where a stepwise movement corresponds to a slow direction and a continuous motion corresponds to a fast movement. In another example embodiment said guiding rail 16 may be moved in a continuous fashion and said carriage 14 may be moved in a stepwise fashion. In still another embodiment said guiding rail 16 may be moved in a continuous fashion and said carriage 14 may also be moved in a continuous fashion. In the embodiments described, the workpiece 10 may be kept in a fixed position while patterning the same. The support structure 13 may be arranged on a vibration damping structure 18. Said vibration damping structure may preferably be made of a high density material and may in turn be supported by an air cushion for further damping vibrations.

In FIG. 4, a far end leg of the guiding rail is omitted for visibility. The optical system 2 generates a scan line, i.e. typically several hundred pixels may be written in the y direction for each x position along the guiding rail. Numerous scan lines will form a strip. A complete pattern comprises numerous strips partly overlapping each other or non-overlapping each other, depending on the writing strategy chosen. Said optical system 2 comprises in one embodiment, a modulator 138, a collimator lens assembly 144 and a deflector 139, see FIG. 1. The modulator 138 may be used to either change the period of illumination time and/or intensity of the electromagnetic radiation from the source 17. Said modulator 138 may for instance be a conventional acousto optical modulator or any other modulator with essentially the same functionality. The deflector may be used to deflect the beam of radiation for creating said scan lines. The deflector may be an acousto optical deflector. A clock generator is connectable to the modulator and may use a 50 MHz frequency. A length of the scan line, i.e., a width of a strip may be 200 μm. Said scan line may comprise about 800 pixels.

In another embodiment said optical head 2 only comprises said deflector 139. In said embodiment the modulator 138 may be arranged at a fixed position from the laser source 17.

The radiation may be generated by a laser source 17 either fixedly mounted on the guiding rail or separated from said guiding rail. The radiation may be expanded, collimated, homogenized and launched by an optical system 19 in a direction essentially parallel to the guiding rail 16, so that it may hit pick up optics 21 on the carriage 14, with virtually unchanging lateral position, angle and cross section during movement along the rail.

The laser source may be a continuous or pulsed laser source. The wavelength of the laser may for instance be 413 nm.

Alignment of the guiding rail 16 with the workpiece may be performed by using interferometers in a conventional manner, see for instance U.S. Pat. No. 5,635,976 assigned to the same applicant as the present invention. In short, a control unit, not shown in the present figures, may initiate the operation of reading pattern data from a storage device and may send instructions or command signals to servo units for controlling the movement of the guiding rail 16. The clock generator may generate a clock signal, which synchronizes operation of data delivery device, the modulator 138 and the deflector 139. The control unit may provide for accurate positioning of the guiding rail with respect to the workpiece 10. The modulator 138 and the deflector may be driven by the same clock signal, which may provide for high degree of accuracy. Position monitoring devices, such as interferometer, detector and a mirror attached to the moving device (here the guiding rail 16), may be monitoring the position of the guiding rail 16 relative to the workpiece 10 and the final lens 3. Together with electric motors, which may move the guiding rail 16, said position monitoring devices form a servo-mechanism. Said servo-mechanism may produce a precisely controlled movement of the guiding rail 16. The clock generator with a certain frequency together with the interferometers with a certain wavelength, may define the initial system grid. A change in the frequency of one of the interferometers, which interferometer may be used to control a position in an X-direction or a Y-direction may change the initial system pitch. Only one interferometer may be used, where two branches of said laser beam may be created with a beam splitter for positioning control in two directions. A change in the wavelength in one branch or a resealing of an initial scale with a certain factor (i.e., one may set the scale individually in X and Y direction) may be used for changing the initial system pitch.

The workpiece 10 may be translated in an appropriate manner, for example with piezo-electrical actuators arranged on at least one end of said support structure 13.

In the illustrated example embodiment in FIG. 4, said workpiece 10 is essentially arranged in parallel with an x-y plane. This x-y plane could be a horizontal plane or a vertical plane. With said x-y plane in parallel with a vertical plane, said workpiece is said to be a standing substrate. An apparatus with a standing substrate requires an essentially smaller clean room area, footprint, than a machine having a horizontal substrate, however, both embodiments require smaller clean room area than conventionally used machines. With a standing substrate 10, said substrate may be less sensitive to contamination, since the exposed area for particles falling down may be drastically reduced compared to a substrate in parallel with a horizontal plane. In another embodiment said substrate may be inclined at any angle between 0-90° from the horizontal plane.

Another feature with a standing substrate is that so-called sag, which is more or less inevitable when having the substrate in parallel with a horizontal plane, could be more or less eliminated with a substrate essentially parallel with the vertical plane. Sag is defined as a deformation of the workpiece due to its weight. A pattern of sag depends on the type of support structures for the substrate, the number of support structures and the size and geometry of said substrate itself.

A stepping motor or the linear motor may move the guiding rail. The guiding rail may slide on air bearings. There may be one air bearing under each leg of the guiding rail 16. In another embodiment said legs of said guiding rail may be coupled to each other, thereby forming a frame structure comprising an upper part on which said carriage is moving in the x direction and a lower part comprising the air bearings along the y direction. Said lower part is below said vibration damping structure 18, i.e., a hollow part of said frame structure will move over the workpiece having the upper part above said workpiece and the lower part below said workpiece.

Fine positioning may exist on said guiding rail or said support structure 13. Said fine positioning may be in the form of mechanical and/or electronic servos. In one embodiment there may be two linear motors operating on said guiding rail for performing said movement in the y direction. Said linear motors may perform said fine positioning by operating them in such a manner so as to rotate the guiding rail.

At an end support of the support structure 13 there may be attached piezoelectric actuators displacing the support structure 13 in the y direction. Said actuators may be driven by analog voltages from a control system including said interferometers, detectors and mirrors and a feed back circuit sensing the position of the support structure 13 relative to that of the guiding rail 16. Together the actuators may correct for the limited resolution in the stepping motor and for non-straight travel of the guiding rail 16. Each actuator may have a movement range of 100 μm.

Instead of compensating said non straight travel of the guiding rail by actuators attached to said support structure 13, said guiding rail itself may be adjusted so that the limited resolution of said stepping or linear motor can be compensated for. In a similar manner actuators may be attached to said guiding rail and by interferometry the position of the support structure relative to the guiding rail may be constantly monitored.

The carriage 14 may slide in the embodiments as illustrated in FIG. 4 on air bearings 22 along the guiding rail 16. It may be driven by a linear electric motor 23 and except for electric cables and air supply tubes there is no physical contact between the rail 16 and the carriage 14. The only forces acting on it are from the contact-less motor 23 and from inertia.

In order to compensate for errors concerning the straightness of the guiding rail 16 or other systematical shape errors, a calibration is possible. After the machine is assembled one has to write or measure a test plate and measure the writing/measurement errors. The errors are stored in a calibration file and fed to the control system as compensation during subsequent writing.

Said acoustooptical deflector in said optical system 2 mounted immediately above said final lens 3 may form the scan lines. Pixels may be 300×300 nm and each scan line may be 200 μm wide. The lens may be an NA=0.5 flat field corrected lens with 4 mm focal length.

Fine positioning in x-direction may be based on the timing of the start-of-scan pulse when the final lens 3 is at its correct position. In y direction the mechanical servos described above may be supplemented by a data-delay feature, which moves the data along the acoustooptical scan as described in DE 40 22 732 A1. This is equivalent to an inertia free feed forward control system raising the bandwidth of the position control to above 100 Hz.

Allowable angle deviations from stroke to stroke of said carriage are less than 10 micro radians, and there must not be any focus shift along said stroke. This may be solved in a number of ways. First, the carriage 14 runs on air bearings preloaded to high stiffness, so that a position of the carriage 14 relative to the guiding rail 16 is well defined and independent of external air pressure and temperature. A non-perfect guiding rail may give a writing error along the scan line. However, this error can be measured during calibration, stored as a correction curve and fed to the position feed back system for compensation during writing. Focus may be kept constant by manipulating the laser beam by collimating and beam shaping optics 19.

Figure 1:
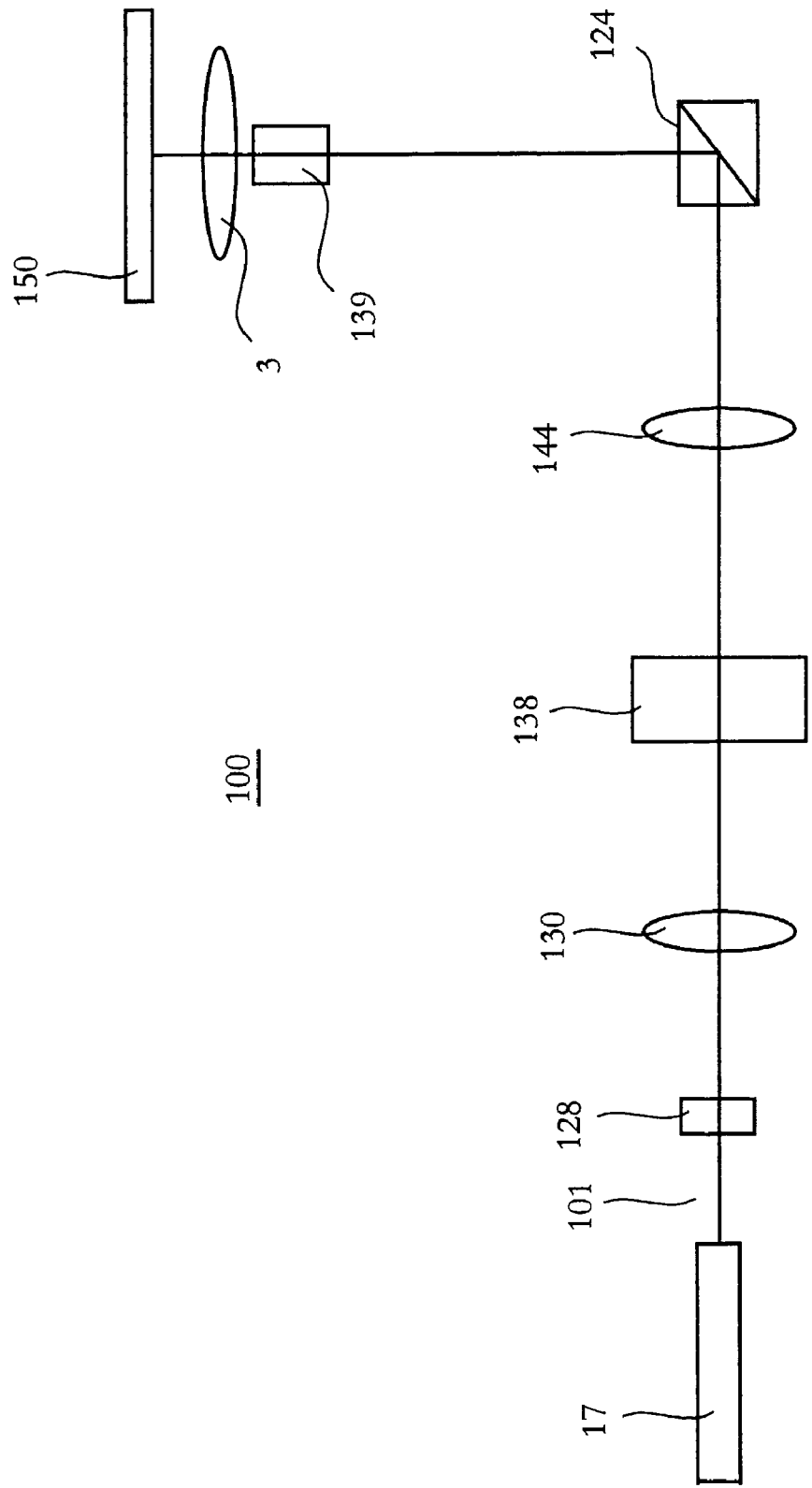
FIG. 1 depicts a schematic overview of a multi beam optical system.

Referring now to FIG. 1, a multi beam optical system for patterning a workpiece 100 may be one example of a system that may benefit from the present invention. The multi beam optical system comprises a laser source 17 a laser beam 101, a diffractive optical element (DOE) 128, modulator lens assembly 130, a modulator 138, collimator lens assembly 144, a prism 124, an acoustooptical deflector 139, a final lens 3 and a workpiece 150.

The laser source 17 may have an output wavelength at 4 13 nm, however . . . other wavelengths may be used. The laser source outputs the laser radiation continuously or in a pulsed fashion.

The diffraction optical element DOE 128, may separate the single laser beam into a plurality of laser beams, for instance 3, 5 or 9 beams, however any number of laser beams is possible to create by inserting one or a plurality of DOEs 128.

The modulator lens assembly 130 may focus each individual laser beam into the modulator 138.

The modulator 138 may modulate the incoming focused plurality of laser beams individually. The modulator 138 may be an acoustooptical modulator.

The prism 124 is inserted in this setup only for compressing the extension of the optical path of the laser beam.

The collimator lens assembly 144 may collimate each individual divergent laser beam coming from the modulator. The collimator lens assembly may provide for the correct separation of the laser beams on the workpiece 150,10.

The acoustooptical deflector 139 may deflect the laser exposure beams onto the workpiece 10 to form said scan lines. The final lens may focus the plurality of laser exposure beams onto the workpiece 150, 10.

The final lens 3 and the modulator 138 may be arranged at a fixed or a movable distance between each other. The collimator lens assembly 144, comprising at least two lenses, may be arranged on motorized rails or may have its internal position changed or its absolute position changed by other suitable means, such as piezo electrical movement. Changing the distance of the collimator lens assembly from the workpiece 150 and changing a focal length of said collimator lens assembly may change the separation of the laser beams on the workpiece 10.

Another way of changing the separation of the individual laser beams on the workpiece 10 may be to adjust the modulator lens assembly 130, so that the separation between the individual laser beams will be changed in the modulator.

Still another way of changing the separation of the individual laser beams on the workpiece may be to mechanically stretch the DOE 128, thereby changing a pitch of the diffractive lattice, which will result in the desired change in beam separation on the workpiece.

Figure 2:
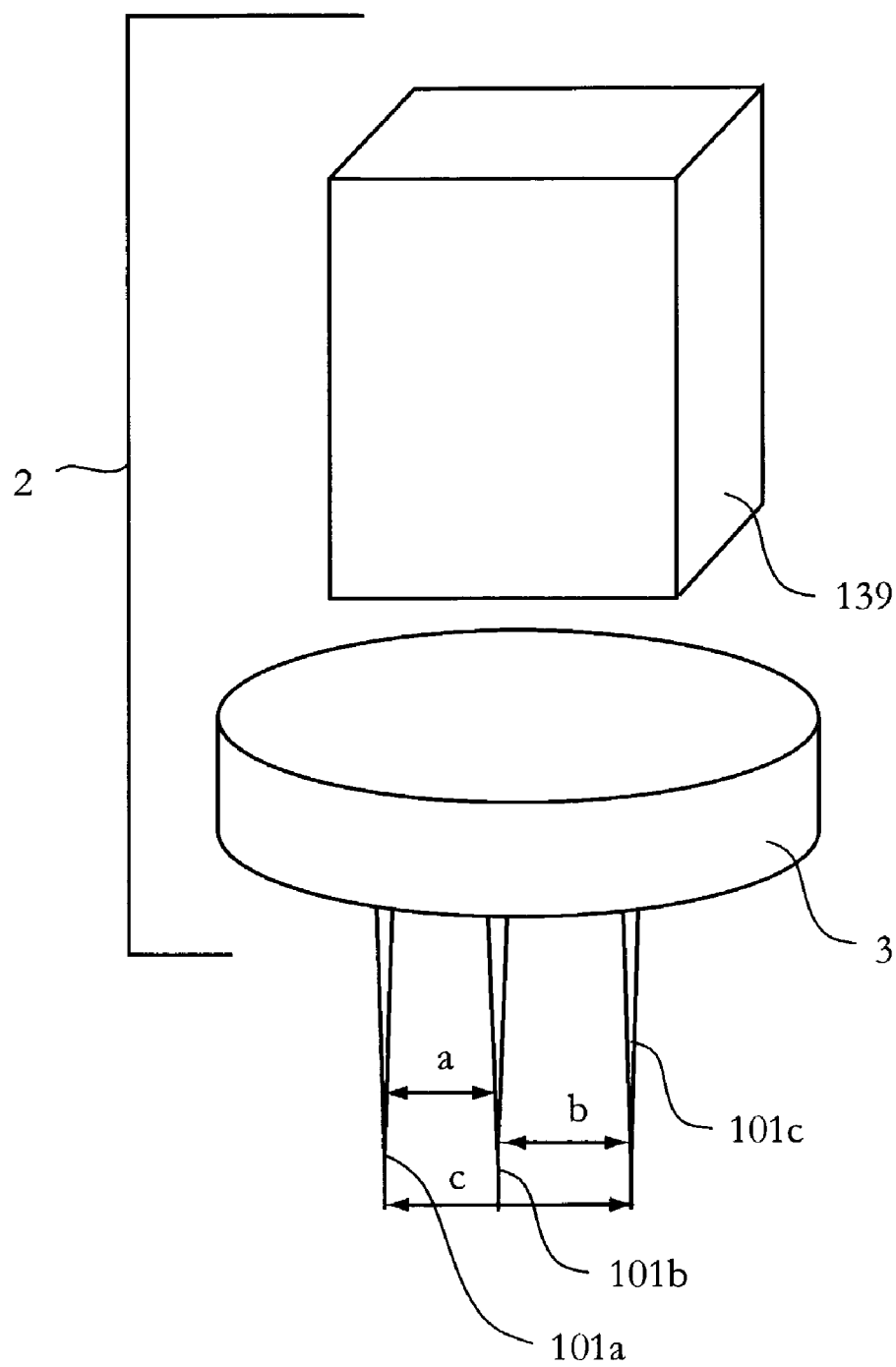
FIG. 2 depicts a deflector and a final lens together with three exposure beams.

FIG. 2 illustrates an enlarged picture of an example embodiment of the optical system 2 comprising the AOD 139 and the final lens 3. An initial separation between the individual laser exposure beams is denoted 101a, 101b, and 101c. Here three laser exposure beams are used, and the separation between two adjacent laser exposure beams, denoted in FIG. 2 with a or b, may be 9.75 µm and the separation between two non adjacent laser exposure beams, i.e., a left most laser exposure beam 101a and a right most exposure beam 101c, denoted in FIG. 2 with c, may be 19.5 µm. The separation of the beams may be essentially perpendicular to a direction of sweeping the exposure beams by means of said AOD 139, i.e., if said separation is extending in an X-direction, the sweep of said laser exposure beams is extending in a Y-direction, which means the scan lines are extending in Y-direction and strips in X-direction. In a multi exposure beam writing strategy the initial separation between individual laser exposure beams may be exact or close to exact to an integer multiple of a system pitch in X-direction.

If the separation in X-direction between individual laser beams is not an integer multiple of said system pitch size in X-direction, edge roughness and pattern dependent CD (critical dimension) variations may appear in the pattern.

Figure 3A:
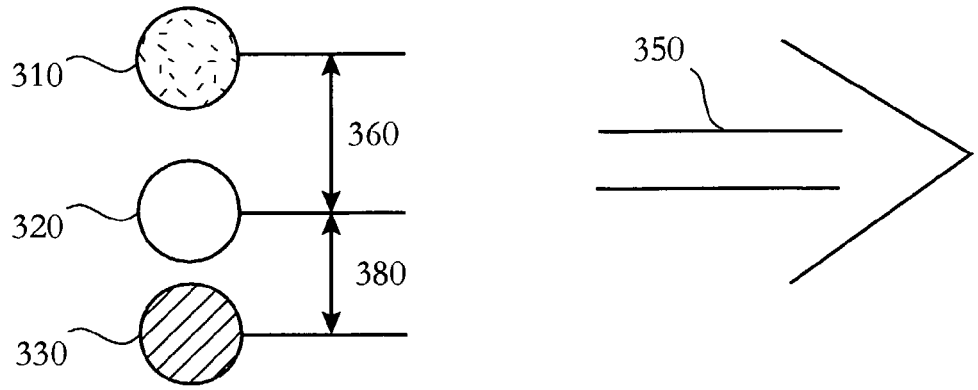
FIG. 3a depicts a multiple beam with different separations between individual beams.

FIG. 3a depicts a possible situation with three exposure beams 310, 320, 330; where the individual distances between adjacent exposure beams are different. Multiple exposure beams may simultaneously form multiple scan lines on the workpiece.

A first scan of multiple exposure beams may be separated at any distance from a second scan of multiple exposure beams.

Here a distance between exposure beam 310 and exposure beam 320, denoted 360 in FIG. 3a, is larger than a distance between exposure beam 320 and exposure beam 330, denoted 380 in FIG. 3a. The distance 360 may in this case be a nominal distance between adjacent exposure beams, hence the distance 380 may be less than the nominal distance between adjacent exposure beams.

Exposure beams 310, 320, 330, which may impinge onto the workpiece, will form scan lines 310A, 320A, 330A, 310B, 320B, 330B, 310C, 320C, 330C. If the separation/distance between each adjacent exposure beams 360, 380 would be equal then all scan lines 310A, 320A, 330A, 310B, 320B, 330B, 310C, 320C, 330C may be written on the workpiece at equal distance from each other. However, when using the exposure beams as depicted in FIG. 3a, each scan line will not appear at. equal distance to its adjacent scan line regardless of the distance chosen between a first and any following scan of multiple exposure beams. Depending on the separation between exposure beams and a separation between two consecutive scans of multiple exposure beams, e.g., a distance between scan line 310 A and scan line 310B, there may be changes to the pattern as exemplified in FIG. 3b, which is valid for the exposure beams as indicated in FIG. 3a and a certain distance between two consecutive multi beam exposures.

Figure 3B:
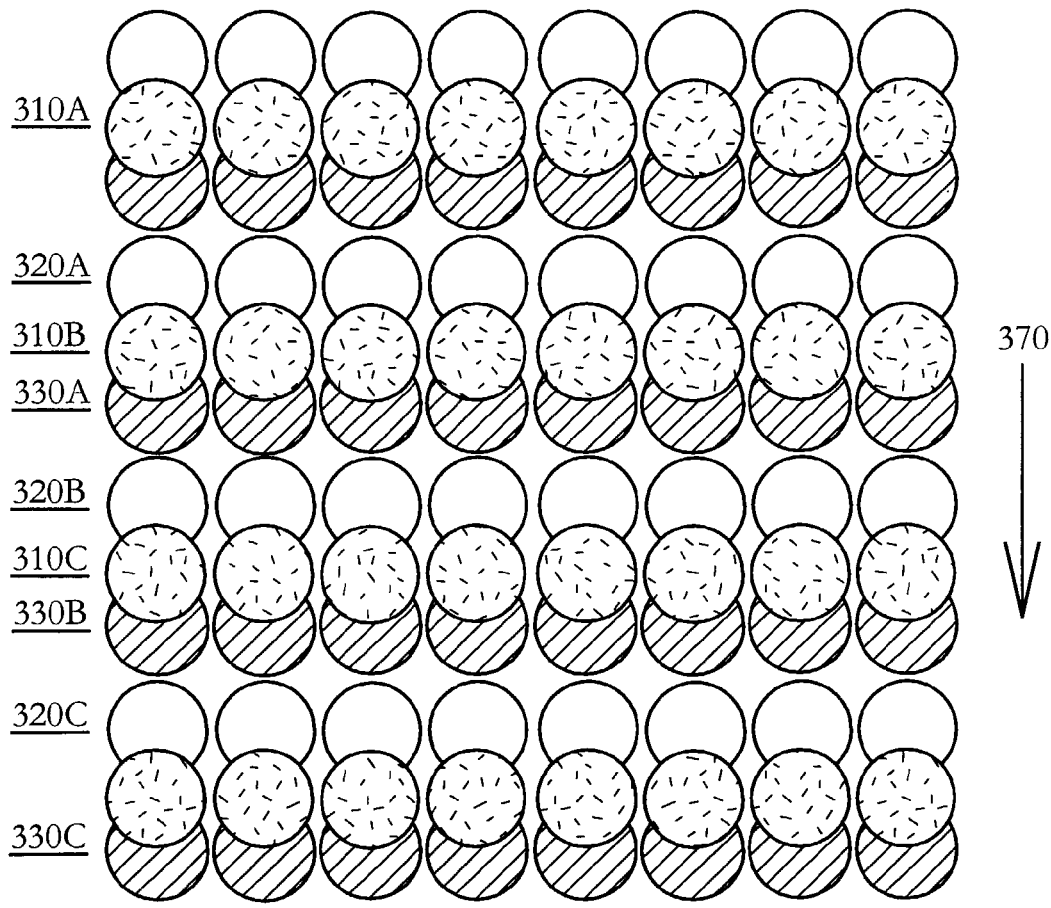

Illustrated circles in FIG. 3b, which are forming the scan lines, may be interpreted as individual exposure spots of the respective exposure beam. A distance between two adjacent circles along a scan line may be a measure of the resolution in said direction. The shorter the distance is between two adjacent circles the higher the resolution. The distance illustrated in FIG. 3b is just an example and the distance between two adjacent circles along a scan line may be chosen to be set at any value.

Arrow 350 in FIG. 3a indicates the direction of scanning the multiple exposure beams 310, 320, 330, which will form multiple scan lines 310A, 320A, 330A, 310B, 320B, 330B, 310C, 320C, 330C on the workpiece. Arrow 370 may indicate the direction of moving the optical head in relation to the workpiece.

The resulting writing situation, when using the exposure beams as depicted in FIG. 3a and by using a specific distance between a first and a second scan of multiple exposure beams, may be as depicted in FIG. 3b. From FIG. 3b, one can easily understand that there may be some problem with the CD uniformity and roughness in a printed pattern. 310A, 320A, 330A indicate the scan lines in a first scan. 310B, 320B, 330B indicate the scan lines in a second scan. 310C, 320C, 330C indicate the scan lines in a third scan. Some of the scan lines are overlapping each other more, e.g., scan lines 310B and 330A; 310C and 330B than a nominal overlap represented in this example embodiment with 320A and 310B; 320B and 31C. Some scan lines are overlapping each other less, in this example embodiment not at all, 330A and 320B; 330B and 320C. The reason for that may be an error in the distance between adjacent exposure beams, i.e., some exposure beams will not hit the workpiece at its intended position because there is a discrepancy in an intended position of an exposure beam and an actual position of an exposure beam. The resulting scan lines will therefore not be written at their intended position. The more one or a plurality of exposure beams differs from its intended position, the more pronounced its effect will be. Non equal overlap of scan lines on the workpiece may affect the resulting writing quality, e.g., bad CD uniformity.

Figure 3C:
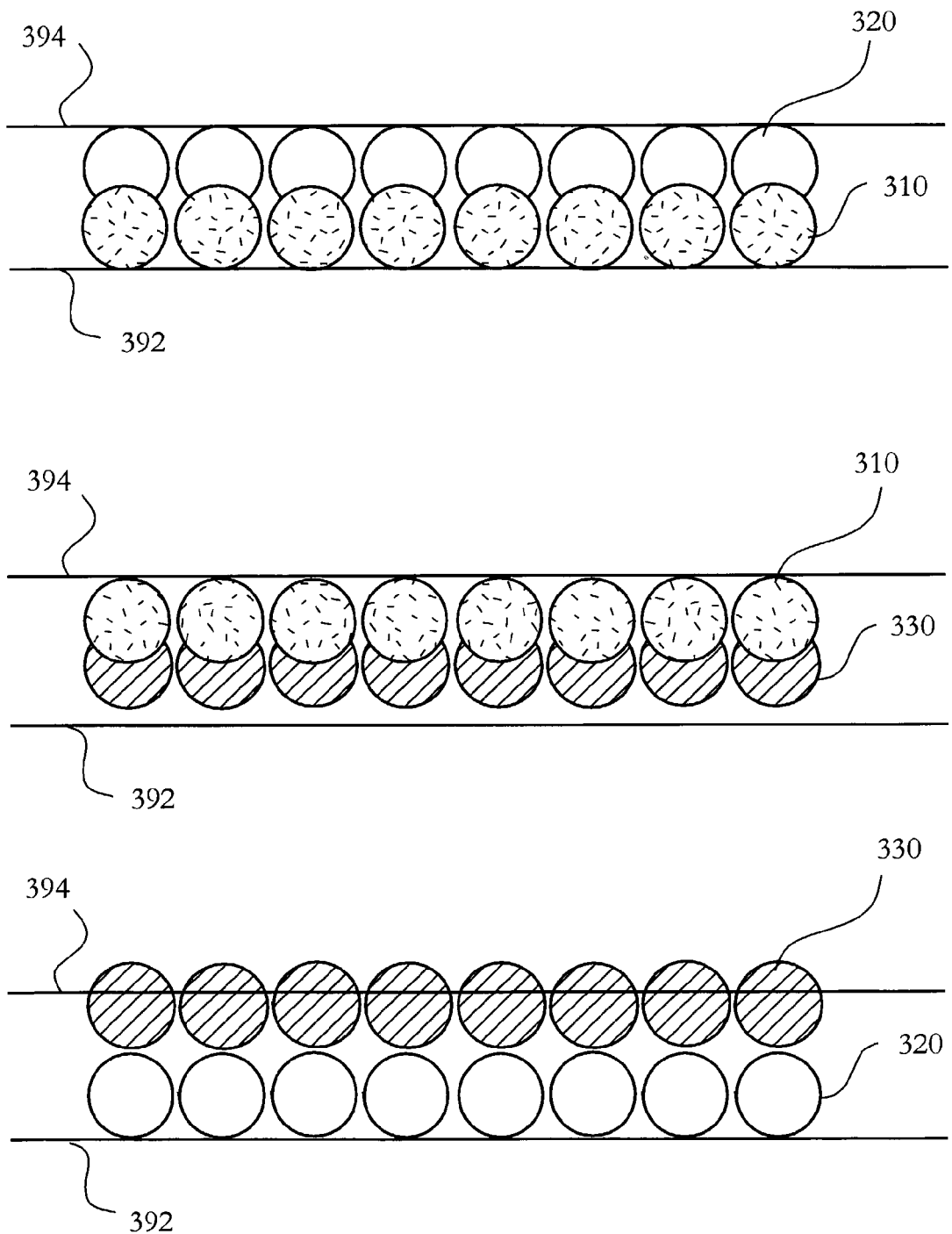

In FIG. 3c it is illustrated three different possibilities of writing a two pixel line, defined by lines 392, 394, by using the exposure beams as illustrated in FIG. 3a and the writing situation as depicted in FIG. 3b. In a nominal width case, top illustration in FIG. 3c, the two pixel line may be written by scan line 310B and 320A. Scan line 310B and 320A may be overlapping each other optimally and therefore these two scan lines 310B and 320A may write the line at its nominal width.

In a below nominal width case, middle illustration in FIG. 3c, the two pixel line is written by scan line 310B and scan line 330A. Here the scan lines may overlap each other too much, because scan lines 310B and 330A are too close to each other, i.e., less than a nominal distance to each other. In a below nominal width case, the two pixel line will be too narrow.

In an above nominal width case, bottom illustration in FIG. 3c, the two pixel line is written by scan line 330A and beam/pixel 320B. In this case there is hardly any overlapping at all, and therefore the two pixel line will be too wide compared to its nominal width. The reason for being too wide is that the closest scan line to scan line 330A is scan line 320B, which is further away than a nominal distance from scan line 330A.

Figure 3D:
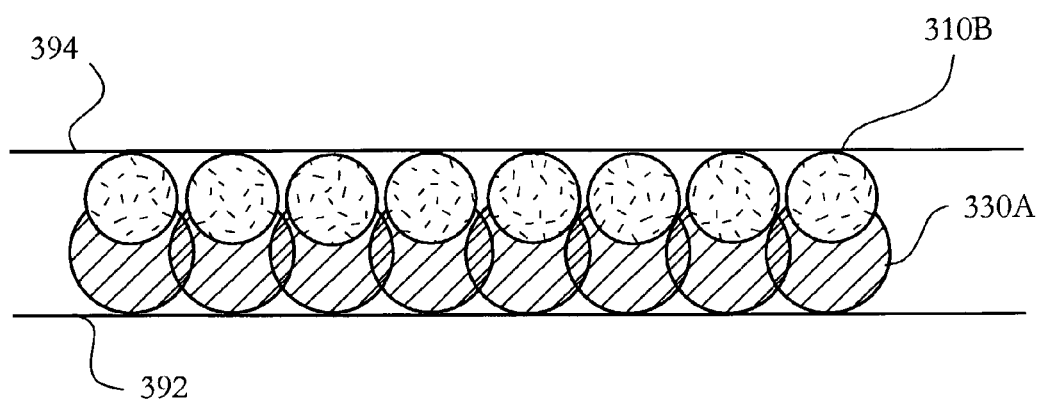
FIG. 3d depicts one example embodiment of printing the line with correct dimension according to the invention.

FIG. 3d illustrates one example embodiment according to the invention of how to solve the below nominal case of writing a two pixel line. By increasing the dose of pixel 330A, said two pixel line may be written at its nominal width.

In FIG. 3b there is information about which pixel will expose which area. Given such information and the pattern data, one can predict which pixel will expose any particular feature in said pattern data before such feature is actually exposed. A pattern as depicted in FIG. 3b may easily be simulated once one knows the separation between the beams and the writing principle.

Figure 3E:
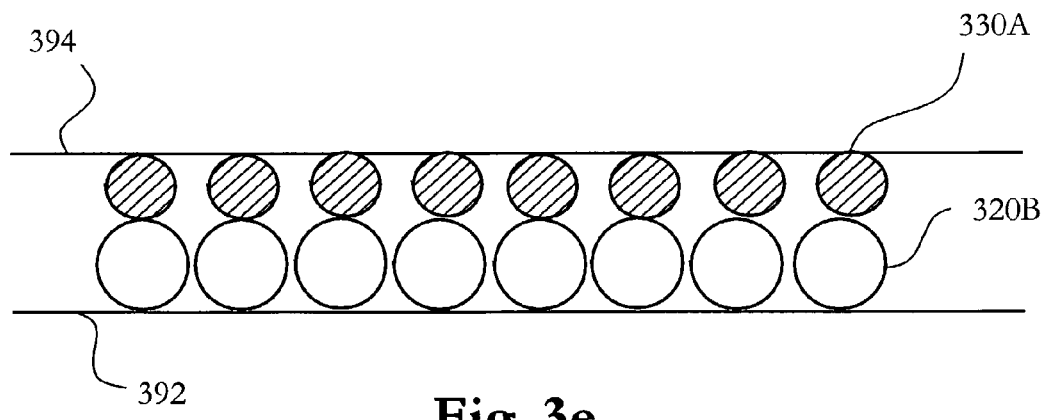
FIG. 3e depicts another example embodiment of printing the line with correct dimension according to the invention.

Imagine you are about to expose a certain pattern with x number of features. If you are choosing a certain writing principle, e.g., certain overlap of specific scan lines and a certain order of exposing the plurality of beams, you will end up with a certain writing situation, which may be the one as illustrated in figure. 3b. Before exposing any particular feature, one will be aware of any discrepancies from the normal situation, as exemplified in FIG. 3c, and may be able to correct for it, as exemplified in FIGS. 3d and 3e. Before exposing a certain pattern a simulation/calculation of the writing may take place. The result of such simulation/calculation may be a table of which pixel will expose which area. Different writing schemes will end up in different writing situations and therefore a different table. Such table may be matched with the pattern to be patterned. By doing so there may be evident which pixel(s) that have to be compensated because the differences in distances between exposure beams will end up in situations as exemplified in FIG. 3c.

As is evident from FIG. 3b, the error in distance between the exposure beams may shows up in a regular pattern. However, compensations or corrections because of such errors may only be relevant in cases where an error exposure beam shows up at a feature edge to be printed, as illustrated in FIG. 3c. In FIG. 3c 330A is a scan line which is written out of its intended position. When a scan line with a position out of its intended position shows up at an edge of a feature, there may be some corrections to be done in order to improve the CD quality of the final pattern.

Since the distance between different adjacent exposure beams may differ, the scan lines may show up at non intended positions, as explained above. At least one of the beams may be considered as the reference beam and placed at its correct and intended position; that is always possible. The first beam may be chosen as a reference beam. One may choose any of the beams as a reference beam, but choosing a beam that is correctly positioned may increase the likelihood of placing one or a plurality of the other beams, which may also be correctly positioned, at its intended positions. The intended position may be related to a predefined distance between individual exposure beams. The exposure beams may be defined to be at equal distance from each other, however there may be cases where different adjacent beams are intended to be at non equal distances to each other.

Figure 5:
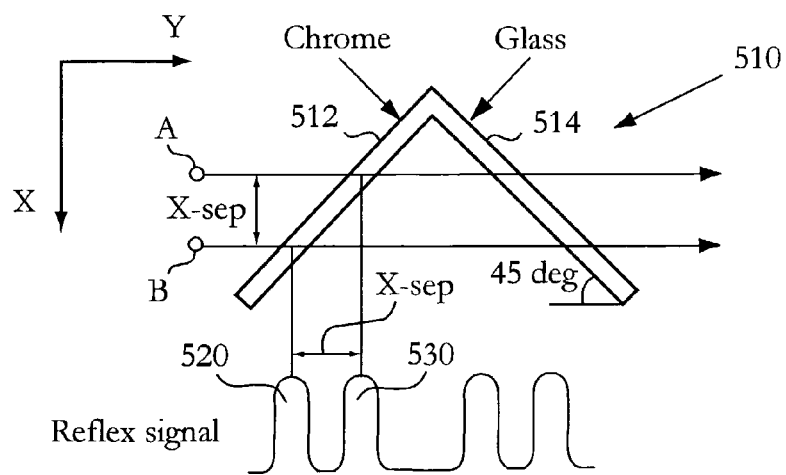
FIG. 5 depicts an example embodiment of a meander pattern to be used when determining a separation distance between exposure beams.

FIG. 5 depicts en example embodiment of measuring an x-distance between adjacent exposure beams A, B, when said beams are scanned in a y direction. This measurement is performed on a meander formed pattern 510. The meander formed pattern 510 comprises +45 and −45 degree chrome lines, 512 and 514 respectively, on a glass background. Other angles may be used, and the angle chosen may depend on the number of exposure beams. When two exposure beams A, B, are sweeping over the meander pattern 510 in said y direction, said exposure beams A, B, may produce two sets of reflex signals 520, 530, which may be detected by a reflex detector. From simple trigonometry it turns out that the physical x-distance between the two beams A, B, are equal to the separation between the two reflex signals 520, 530. In order to handle possible rotation of the meander formed pattern 510, it may be required to extract the separation of the exposure beams A, B, as an average of the measurement from two 180 degrees rotations of the meander formed pattern 510. In order for the separation measurement to work it thus has to be a total of four reflex peaks for two exposure beams A, B, (2×N reflexes for N beams) visible within a measurement window.

In another embodiment according to the present invention a correction of a scan line that is not at its intended position may be adjusted regardless if said scan line is written at a feature edge or not. One or a plurality of tables can be made, in which information can be found if a previous scan line is to be written (exposure beam on) or not written (exposure beam off). In the middle illustration in FIG. 3c the previous scan line 310B is to be written and in such case the intensity for scan line 330A may be increased in order to achieve a nominal width of the two pixel line. The intensity for scan line 330A may always be increased when the previous scan line has been written. For instance, within a feature scan lines 330A, B, C etc. may have its intensity increased because a previous scan line has been written.

In the bottom illustration of FIG. 3c the previous scan line is not to be written before scan line 330A. In such case the intensity for scan line 330A should be decreased regardless if scan line 330A is written at a feature edge or not.

One may have a first table of information of what to do with at least one scan lines if a previous scan line is to be written and a second table of information of what to do with at least one scan line if the previous scan line is not to be written.

In the example described above scan lines are written in a direction indicated by arrow 370 in FIG. 3b. A person skilled in the art may easily understand that if said direction of writing said scan lines is reversed there may be another condition for increasing or decreasing the intensity for a particular scan line. Such a condition may be if said previous scan line has or has not been written. By previous scan line is meant the very closest scan line to any given scan line, for example the previous scan line to 310B in FIG. 3b is 320A by using the writing principle chosen for creating the particular pattern.

The intensity compensation for a particular scan line may be performed on the fly while writing the pattern by using the information in said tables.

In another example embodiment according to the present invention, a compensation may be performed for variations in separations between adjacent exposure beams along a strip. For instance, there may be a first pattern of separation of exposure beams in a beginning of a strip and a second pattern of separation of exposure beams at an end of a strip. The reason for that may be imperfect optical components. The separation may not only change in the direction perpendicular to the direction of scanning the plurality of exposure beams but also in the direction of scanning said plurality of exposure beams. The pattern of separation may be detected at different positions in the strip and stored in a table. A compensation of the variations in the separations between adjacent exposure beams may be compensated for along said strip. By applying an appropriate change in the intensity of certain exposure beams, dimensions of features to be written on said workpiece may be written closer to its nominal width than if said compensation would not have taken place. In one example embodiment, the exposure dose D=f(beam#, StripXpos), where beam# is the particular exposure beam in question and StripXpos is the position of the strip, i.e., beginning of a sweep, middle of the strip, at the end of the strip or any other position along a strip.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims. For instance may the support structure be moving in one direction and the optical system in a perpendicular direction with the guiding rail at a fixed position as disclosed in U.S. Pat. No. 5,635,976.

The invention claimed is:

1. A method for patterning a workpiece covered at least partly with a layer sensitive to electromagnetic radiation by simultaneously using a plurality of exposure beams, comprising the actions of:
   compensating for deviations from a nominal value in distance between adjacent exposure beams by adjusting the dose of at least one of said plurality of exposure beam to reduce CD-errors in said pattern on said workpiece.

2. The method according to claim 1, wherein said compensation varies along at least one strip of said plurality of exposure beams.

3. A method for patterning a workpiece covered at least partly with a layer sensitive to electromagnetic radiation by simultaneously using a plurality of exposure beams, comprising the actions of,
   collecting information about which beam(s) will expose which feature in a pattern to be patterned on said workpiece,
   determining the distances between adjacent exposure beams,
   compensating for deviations from a nominal value in distance between adjacent exposure beams by adjusting the dose of at least one of said plurality of exposure beam.

4. The method according to claim 3, wherein said dose is changed only if the beam is patterning an edge feature.

5. The method according to claim 3, wherein said collecting of information is performed before patterning the feature.

6. The method according to claim 3, wherein said collecting of information is performed at least partly during the patterning.

7. The method according to claim 3, wherein said distance between adjacent beams is determined on the workpiece.

8. The method according to claim 3, wherein said distance between adjacent beams is determined by at least one measurement on a reference mark.

9. The method according to claim 3, wherein said compensation varies along at least one strip of said plurality of exposure beams.

10. A method for patterning a workpiece covered at least partly with a layer sensitive to electromagnetic radiation by simultaneously using a plurality of exposure beams, comprising the actions of:
    determining if any of the beams have an actual position relative to a reference beam which differs from its intended position,
    adjusting the exposure dose for a wrongly positioned beam if said beam is printed at en edge of a feature.

11. The method according to claim 10, wherein said adjustment varies along at least one strip of said plurality of exposure beams.

12. The method according to claim 10, wherein said actual position is measured on the workpiece.

13. The method according to claim 10, wherein said actual position is measured on a reference mark.

* * * * *